US010539028B2

(12) United States Patent
Duval et al.

(10) Patent No.: US 10,539,028 B2
(45) Date of Patent: Jan. 21, 2020

(54) METHOD OF OPTIMIZING THE PROFILE OF A COMPOSITE MATERIAL BLADE FOR ROTOR WHEEL OF A TURBINE ENGINE, AND A BLADE HAVING A COMPENSATED TANG

(75) Inventors: Sylvain Yves Jean Duval, Tournan en Brie (FR); Clement Roussille, Bordeaux (FR); Alain Schweitzer, Leognan (FR); Patrick Joseph Marie Girard, Saint Fargeau Ponthierry (FR)

(73) Assignees: SNECMA, Paris (FR); HERAKLES, Le Haillan (FR)

( * ) Notice: Subject to any disclaimer, the term of this patent is extended or adjusted under 35 U.S.C. 154(b) by 1989 days.

(21) Appl. No.: 13/884,682

(22) PCT Filed: Nov. 8, 2011

(86) PCT No.: PCT/FR2011/052591
§ 371 (c)(1),
(2), (4) Date: May 10, 2013

(87) PCT Pub. No.: WO2012/062991
PCT Pub. Date: May 18, 2012

(65) Prior Publication Data
US 2013/0230404 A1  Sep. 5, 2013

(30) Foreign Application Priority Data
Nov. 10, 2010 (FR) ...................... 10 59292

(51) Int. Cl.
*F01D 5/28* (2006.01)
*F04D 29/38* (2006.01)
*G06F 17/50* (2006.01)

(52) U.S. Cl.
CPC ............. *F01D 5/282* (2013.01); *G06F 17/50* (2013.01)

(58) Field of Classification Search
CPC ... F01D 5/14; F01D 5/28; F01D 5/282; F04D 29/38; F04D 29/384; F04D 29/386;
(Continued)

(56) References Cited

U.S. PATENT DOCUMENTS 2,660,401 A * 11/1953 Hull, Jr. .................. F01D 5/141
                                                    416/175
4,012,172 A *  3/1977 Schwaar ................. F01D 5/141
                                                    416/223 A
(Continued)

FOREIGN PATENT DOCUMENTS

EP          1 939 458          7/2008

OTHER PUBLICATIONS

International Search Report dated Mar. 26, 2012 in PCT/FR11/52591 Filed Nov. 8, 2011.

*Primary Examiner* — Justin D Seabe
*Assistant Examiner* — Joshua R Beebe
(74) *Attorney, Agent, or Firm* — Oblon, McClelland, Maier & Neustadt, L.L.P.

(57) ABSTRACT

A method optimizing a composite material blade profile for a rotor wheel of a turbine engine, and a blade including a tang compensated by the method. The method includes: compensating a blade airfoil by subdividing the airfoil into slices, and for each airfoil slice and a predetermined rotation speed of a disk of the wheel, calculating centrifugal force applied to the slice, calculating an aerodynamic force moment acting on a bottom section of the slice, and calculating shift values to be applied to a center of gravity of the slice to cancel the aerodynamic force moment; and compensating the blade tang by calculating centrifugal force applied to a blade portion situated beyond the airfoil neck, calculating an aerodynamic force moment acting on a bottom section of the blade tang, and calculating shift values to (Continued)

be applied to a center of gravity of the blade tang to cancel the aerodynamic force moment.

8 Claims, 2 Drawing Sheets

(58) Field of Classification Search
CPC ............... F04D 29/324; F05D 2220/32; F05D 2200/13; F05D 2200/12; F05D 2240/301; F05D 2250/171; F05D 2250/70; F05D 2260/15; F05D 2260/94; F05D 2260/941; F05D 2260/81; F05D 2300/6033; G06F 17/50
See application file for complete search history.

(56) References Cited

U.S. PATENT DOCUMENTS

| | | | | |
|---|---|---|---|---|
| 4,585,395 | A * | 4/1986 | Nourse | F01D 5/141 415/181 |
| 5,044,885 | A * | 9/1991 | Odoul | F01D 5/22 416/196 R |
| 5,088,892 | A * | 2/1992 | Weingold | F01D 5/145 415/193 |
| 5,342,170 | A * | 8/1994 | Elvekjaer | F01D 5/142 415/191 |
| 6,299,412 | B1 * | 10/2001 | Wood | F01D 5/141 416/223 A |
| 6,565,320 | B1 * | 5/2003 | Surls | F04D 29/329 416/175 |

\* cited by examiner

METHOD OF OPTIMIZING THE PROFILE OF A COMPOSITE MATERIAL BLADE FOR ROTOR WHEEL OF A TURBINE ENGINE, AND A BLADE HAVING A COMPENSATED TANG

BACKGROUND OF THE INVENTION

The present invention relates to the general field of designing a composite material blade for a rotor wheel of a turbine engine.

The intended field is that of moving blades of gas turbines for aeroengines or for industrial turbines.

Proposals have already been made to make turbine engine blades out of composite material, in particular out of ceramic matrix composites (CMCs). Reference may be made in particular to document FR 2 939 129 which describes fabricating a turbine engine blade out of composite material comprising fiber reinforcement densified by a matrix.

It is known that metal blades present mechanical strength characteristics that become greatly degraded at high temperatures, which makes it necessary to optimize the geometrical profile of such a blade in hot zones, specifically in its airfoil, in order to reduce the mechanical stresses to which the blade is subjected in operation.

Unlike metal blades, CMC blades present mechanical strength characteristics that are better at withstanding high temperatures, thereby shifting the critical zone of the blade to its root (which is a cold portion). High mechanical stresses appear at the root of the blade while the blade is in rotation.

OBJECT AND SUMMARY OF THE INVENTION

A main object of the present invention is thus to mitigate such drawbacks by proposing a method of optimizing the profile of a composite material blade that makes it possible to reduce the mechanical stresses to which the blade is subjected in operation.

This object is achieved by a method of optimizing the profile of a composite material blade, the blade comprising an airfoil constituted by a plurality of blade sections stacked in a radial direction of the wheel, a root for mounting on a disk of the wheel and extended by a tang, and an inner platform situated between the tang and the airfoil, the root being connected to the tang by a neck, the method comprising, in accordance with the invention, the following steps:

a step of compensating the blade airfoil, which step consists in subdividing the airfoil into slices, each defined between a bottom section and a top section, and for each airfoil slice and for a predetermined speed of rotation of the wheel disk, calculating the centrifugal force to which the slice is subjected, calculating the moment of the aerodynamic force acting on the bottom section of the slice, and calculating shift values to be applied to the center of gravity of the slice in tangential and radial directions in order to cancel the moment of the aerodynamic force acting on the bottom section of said slice; and a step of compensating the blade tang, consisting in calculating the centrifugal force to which a portion of the blade situated above the neck is subjected, which portion is constituted by the airfoil, by the inner platform, and by the tang, calculating the moment of the aerodynamic force acting on a bottom section of the tang of the blade, and calculating shift values to be applied to a center of gravity of the blade tang along the tangential and longitudinal direction in order to cancel the moment of the aerodynamic force acting on the bottom section of the blade tang.

In operation, the blade is subjected both to aerodynamic forces due to the flow of gas passing through the engine and to centrifugal forces due to the rotation of the wheel. The step of compensating the airfoil by the method of the invention consists in shifting the centers of gravity of the various blade sections of the airfoil in tangential and longitudinal directions in order to compensate the bending moment due to the aerodynamic forces by means of the bending moment due to the centrifugal forces. More precisely, the aerodynamic forces generate a moment at the bottom of the airfoil. By shifting the centers of gravity of the various airfoil slices in the same direction as the aerodynamic forces, a centrifugal force moment is organized that opposes the moment due to the aerodynamic forces.

Furthermore, the aerodynamic forces also generate a moment in the blade tang. During the step of compensating the tang, the method of the invention provides for compensating this moment by the bending moment due to the centrifugal forces and thereby obtain a balance between the moments at the tang of the blade.

By balancing moments both at the bottom of the airfoil and at the tang of the blade, it becomes possible to reduce the mechanical stresses to which the blade is subjected in operation. This leads to an increase in the lifetime of the blade and makes it possible to use a material in the zone of the blade root that presents mechanical strength that is weaker (or more limited) than the strength presented by conventional metal materials. Furthermore, the optimization of the blade tang profile is beneficial to its mass and to its size.

Advantageously, the shift values to be applied to the centers of gravity of the airfoil slices and to the blade tang are smoothed over the full height of the blade. This operation makes it possible to obtain an airfoil profile that does not harm the aerodynamic performance of the blade.

The centrifugal force to which an airfoil slice may be subjected is given by the following formula:

$$F_C = M_T \times R_{COG} \times \omega^2$$

with $M_T$ being the mass of the airfoil slice; $R_{COG}$ being the distance between the axis of rotation of the disk and the center of gravity of the airfoil slice; and $\omega$ being the speed of rotation of the disk at the predetermined speed.

The shift values for application to the center of gravity of an airfoil slice may be given by the following formulas:

$$\delta_X = M_{Y\text{-}faero}/F_C$$

$$\delta_Y = M_{X\text{-}faero}/F_C$$

with: $M_{X\text{-}faero}$ being the component of the moment of the aerodynamic force acting on the bottom section of the slice in the longitudinal direction; and $M_{Y\text{-}faero}$ being the component of the moment of the aerodynamic force acting on the bottom section of the slice in the tangential direction.

Likewise, the shift values ($\delta'_X, \delta'_Y$) for application to the center of gravity of an airfoil slice may be given by the following formulas:

$$\delta'_X = M'_{Y\text{-}faero}/F'_C$$

$$\delta'_Y = M'_{X\text{-}faero}/F'_C$$

with: $M'_{X\text{-}faero}$ being the component of the moment of the aerodynamic force acting on the bottom section of the blade tang in the longitudinal direction; and $M'_{Y\text{-}faero}$ being the component of the moment of the aerodynamic force acting on the bottom section of the blade tang in the tangential direction.

When the blade also includes an outer platform in the vicinity of the free end of the airfoil, the step of compensating the tang preferably applies to a portion of the blade constituted by the airfoil, the inner platform, the tang, and the outer platform of the blade.

In the step of compensating the blade airfoil, the airfoil may be subdivided into ten slices, each occupying 10% of the total height of the airfoil.

The invention also provides a composite material blade for a rotor wheel of a turbine engine, the blade comprising an airfoil made up of a plurality of blade sections stacked in a radial direction of the wheel, a root for mounting on a disk of the wheel and extended by a tang, and an inner platform situated between the tang and the airfoil, the root being connected to the tang by a neck, wherein, in accordance with the invention, the coordinates of the center of gravity of the blade tang in an (O, X, Y, Z) orthogonal reference frame are given by the following formulas:

$$D'_X = D_X + \delta'_X$$

$$D'_Y = D_Y + \delta'_Y$$

$$D'_Z = D_Z$$

where:

$D_X$, $D_Y$, and $D_Z$ are the coordinates of the center of gravity of the blade tang without compensation; and $\delta'_X$ and $\delta'_Y$ are compensation values for the tang given by the following formulas:

$$\delta'_X = M'_{Y\text{-}faero}/F'_C$$

$$\delta'_Y = M'_{X\text{-}faero}/F'_C$$

with:

$M'_{X\text{-}faero}$ being the component of the moment of the aerodynamic force acting on the bottom section of the blade tang in the longitudinal direction (X); and $M'_{Y\text{-}faero}$ being the component of the moment of the aerodynamic force acting on the bottom section of the blade tang in the tangential direction (Y).

BRIEF DESCRIPTION OF THE DRAWINGS

Other characteristics and advantages of the present invention appear from the following description given with reference to the accompanying drawings that show an implementation having no limiting character. In the figures.

DETAILED DESCRIPTION OF AN EMBODIMENT

Figure 1:
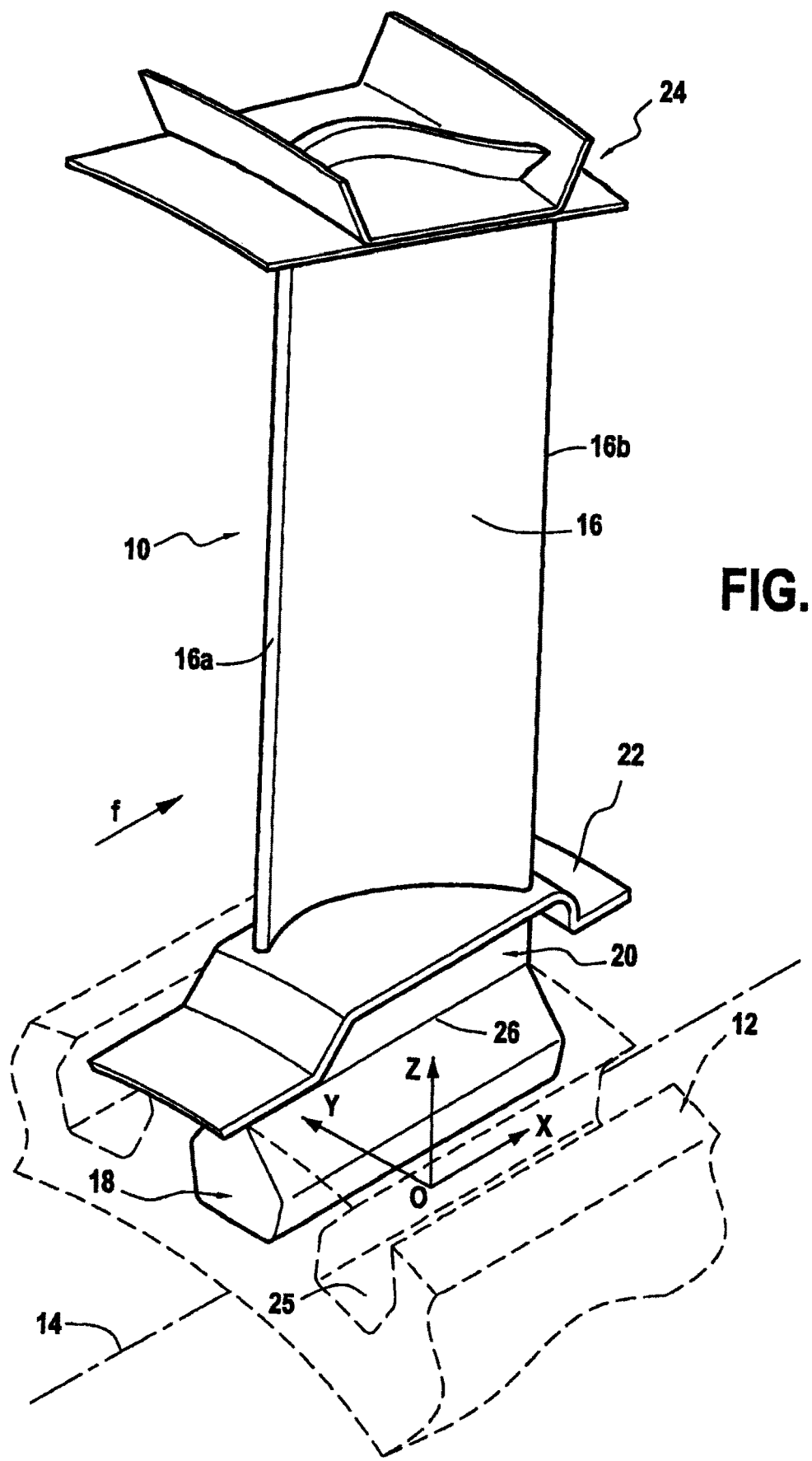
FIG. 1 is a diagrammatic perspective view of an example of a blade to which the method of the invention applies.

The invention is applicable to various types of turbine engine blade, and in particular to turbine and compressor blades of various gas turbine spools, e.g. a rotor wheel blade of a low pressure turbine, such as that shown in FIG. 1.

The blade 10 of FIG. 1 is for mounting on a disk 12 of a rotor wheel that is centered on a longitudinal axis 14 of the engine. This rotor wheel defines three mutually perpendicular axes forming an orthogonal reference frame (O, X, Y, Z) defined by a longitudinal axis X (parallel to the longitudinal axis 14 of the engine), a tangential axis Y, and a radial axis Z, the origin of the reference plane being centered on the longitudinal axis 14 of the engine.

In well-known manner, the blade 10 comprises an airfoil 16, a root 18 formed by a portion of greater thickness, e.g. presenting a bulb-shaped section, and extended by a tang (or strut) 20, an inner platform 22 situated between the tang and the airfoil, and an outer platform 24 in the vicinity of the free end of the airfoil. The blade is made up of a plurality of blade sections that are stacked along the radial axis Z.

The airfoil 16 extends along the radial axis Z between the inner platform 22 and the outer platform 24, and in cross-section it presents a curved profile of varying thickness between its leading edge 16a and its trailing edge 16b.

The blade 10 is mounted on the disk 12 by engaging the root 18 in a slot 25 of complementary shape formed in the periphery of the disk. The root 18 is connected to the tang 20 by a neck 26.

At its radially inner end, the airfoil 16 is connected to the inner platform 22 that defines the inside of the flow passage for the stream of gas through the turbine. At its radially outer end, the airfoil 16 is connected to the outer platform 24 that defines the outside of the flow passage for the stream of gas that flows through the turbine.

The blade 10 is made of composite material, e.g. of CMC. Reference may be made to document FR 2 939 129, which describes an example of fabricating such a blade.

In operation, the blade is subjected firstly to aerodynamic forces due to the flow of the gas stream passing through the turbine, and secondly to centrifugal forces due to the rotation of the rotor wheel 12 about the longitudinal axis 14. These (aerodynamic and centrifugal) forces act in particular to generate bending moments at the bottom of the airfoil (i.e. in the vicinity of the inner platform 22), and also at the neck 26 connecting the root 18 to the tang 20.

In the invention, provision is made to optimize the profile of the blade so as to obtain a balance between the bending moments due to aerodynamic forces and the bending moments due to centrifugal forces. This optimization is implemented for a particular stage of flight that is characterized in particular by a predetermined speed of rotation ω for the disk of the wheel.

In general manner, optimizing the profile of the blade consists in shifting the centers of gravity of the various blade sections in tangential and longitudinal directions in order to achieve such a balance. Ideally, if optimization is optimal, the blade sections will not be subjected to bending stress but will be subjected only to pure traction stress (centrifugal forces).

Figure 2:
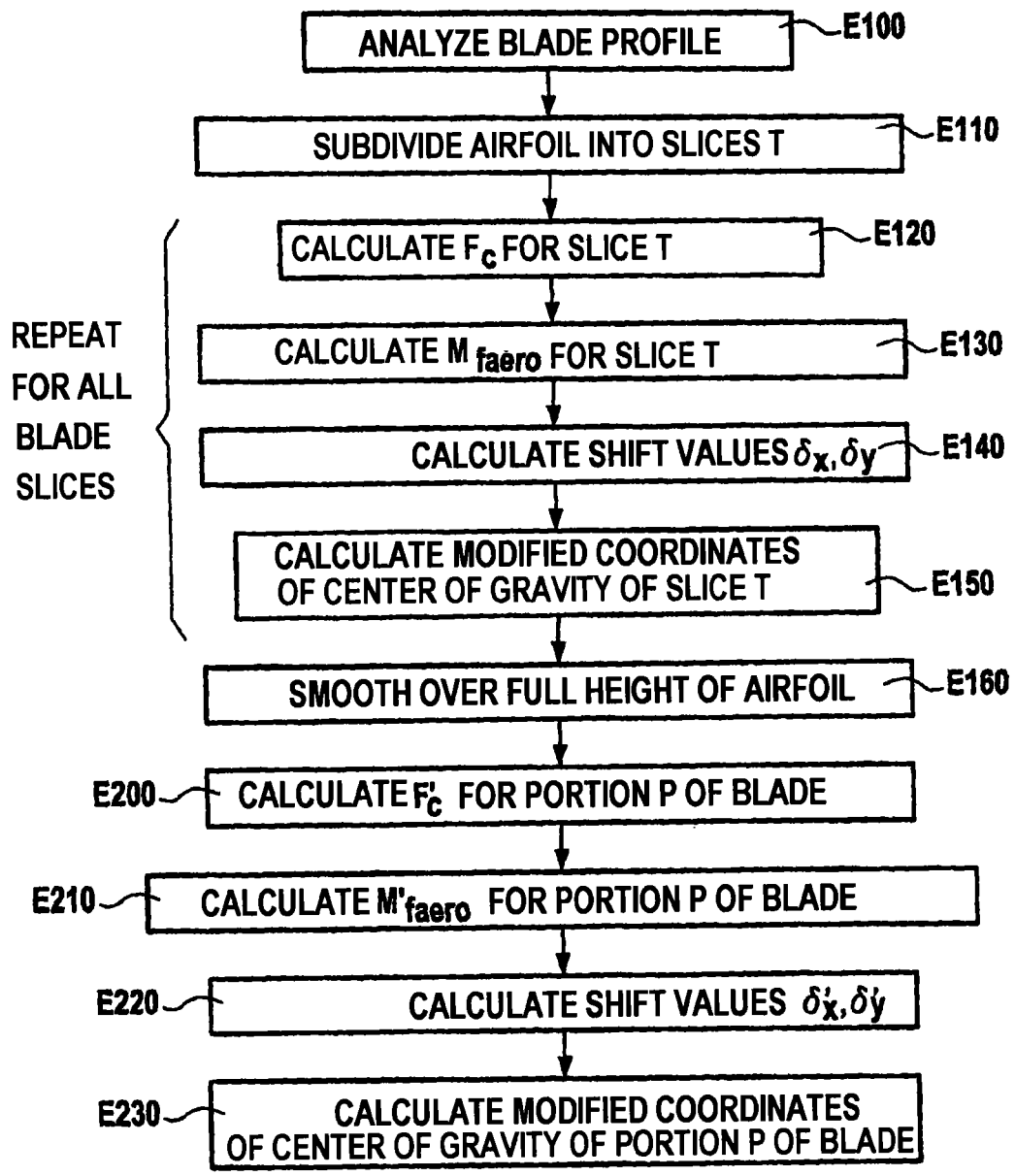
FIG. 2 gives the successive steps of a method of optimizing the profile of a blade in accordance with the invention.

FIG. 2 shows the various steps of a method of the invention for optimizing the profile of the blade. These steps are performed by means of appropriate calculation software. They comprise steps of compensating the airfoil of the blade and steps of compensating the tang of the blade. A particular application example of the method is described below.

In a first step E100 of the method, values relating to the geometrical profile of the blade, to its dimensions, and to its mass are entered into the calculation software.

In order to perform compensation of the airfoil of the blade, the airfoil is initially geometrically subdivided along the radial axis Z into a plurality of slices T, each slice T being defined between a bottom blade section and a top blade section (step E110). For example, ten slices T may be selected each occupying 101 of the total radial distance between the outer platform and the inner platform of the blade.

Each airfoil slice as defined in this way is associated with a slice mass $M_T$ and coordinates ($C_X$, $C_Y$, $C_Z$) of the center of gravity of the slice in the above-defined orthogonal reference frame (O, X, Y, Z).

For each airfoil slice T and for each predetermined speed of rotation w of the disk of the wheel, the centrifugal force $F_C$ to which the slice is subjected is then calculated (step E120). The calculation is given by the following equation:

$$F_C = M_T \times R_{COG} \times \omega^2$$

where $R_{COG}$ represents the distance between the axis of rotation of the disk and the center of gravity of the airfoil slice (i.e. $R_{COG}$ corresponds to the value of $C_Z$).

In parallel with this step E120, the moment $M_{faero}$ of the aerodynamic forces acting on the bottom section of the same airfoil slice T is calculated, and more precisely the components $M_{X-faero}$ in the longitudinal direction and $M_{Y-faero}$ in the tangential direction of the moment are calculated (step E130). This calculation is performed on the basis of aerodynamic forces that are calculated using appropriate software and on the basis of the distance between the aerodynamic thrust center of the slice in question and the bottom section of the slice.

Using the data $F_C$, $M_{X-faero}$, and $M_{Y-faero}$, it is possible to calculate values for the shifts to be applied to the coordinates ($C_X$, $C_Y$, $C_Z$) of the center of gravity of the airfoil slice T in question during a step E140.

More precisely, these shift values are calculated so as to compensate (i.e. cancel) the moment $M_{faero}$ of the aerodynamic forces acting on the bottom section of the blade slice T, and they are obtained using the following equations:

$$\delta_X = M_{Y-faero}/F_C$$

$$\delta_Y = M_{X-faero}/F_C$$

where $\delta_X$ and $\delta_Y$ are the shift values to be applied to the coordinates $C_X$ and $C_Y$ respectively of the center of gravity of the airfoil slice T.

In the following step E150, the modified coordinates ($C'_X$, $C'_Y$, $C'_Z$) are then calculated in the (O, X, Y, Z) reference frame for the center of gravity of the airfoil slice T with the help of the following formulas:

$$C'_X = C_X + \delta_X$$

$$C'_Y = C_Y + \delta_Y$$

$$C'_Z = C_Z$$

The above enumerated steps E120 to E150 are repeated for all of the airfoil slices T, starting from the top slice (i.e. the slice situated in the vicinity of the outer platform of the blade) and going down to the bottom slice (i.e. the slice situated in the vicinity of the inner platform). At the end of these steps, the modified coordinates are obtained for the centers of gravity of all of the airfoil slices. The profile of the blade is thus optimized for a predetermined stage of flight.

Advantageously, an additional step E160 consists in smoothing the set of modified coordinates ($C'_X$, $C'_Y$, $C'_Z$) as obtained in this way over the entire height of the airfoil. This operation may be performed using any known method for smoothing values. It enables the centers of gravity of the various airfoil slices to be aligned on a curve that avoids penalizing the aerodynamic performance of the airfoil.

After those steps, the tang of the blade is compensated in analogous manner. A first step E200 consists in calculating the centrifugal force $F'_C$ to which the portion P of the blade is subjected, which portion P is constituted by the airfoil, by the inner platform, and by the tang (i.e. everything that is above the neck of the blade). This centrifugal force $F'_C$ is given by the following formula:

$$F'_C = M_P \times R'_{COG} \times \omega^2$$

with: $M_P$ being the mass of the portion P of the blade; $R'_{COG}$ being the distance between the axis of rotation of the disk and the center of gravity of the portion P of the blade; and $\omega$ being the speed of rotation of the disk at the predetermined speed.

It should be observed that if the blade has an outer platform with wipers (as shown in FIG. 1), then the portion P of the blade is constituted by everything that is situated above the neck of the blade, i.e. the airfoil, the tang, the inner platform, the outer platform, and its wipers.

The moment $M'_{faero}$ of the aerodynamic force acting on the bottom section of the tang of the blade is calculated, and more particularly the components $M_{X-faero}$ in the longitudinal direction and $M_{Y-faero}$ in the tangential direction of this moment are calculated (step E210). This calculation is performed with the help of calculation software in a manner analogous to the modeling described with reference to step E130.

From this data $F'_C$, $M'_{X-faero}$ and $M'_{Y-faero}$ shift values $\delta'_X$ and $\delta'_Y$, may be calculated for application to the coordinates $D'_X$ and $D'_Y$ respectively of the center of gravity of the blade tang during a step E220. These shift values (also referred to as tang compensation values) are calculated so as to compensate the moment $M'_{faero}$ of the aerodynamic forces and they are obtained using the following equations:

$$\delta'_X = M'_{Y-faero}/F'_C$$

$$\delta'_Y = M'_{X-faero}/F'_C$$

The modified coordinates ($D'_X$, $D'_Y$, $D'_Z$) in the (O, X, Y, Z) reference frame for the center of gravity of the tang of the blade are then as follows:

$$D'_X = D_X + \delta'_X$$

$$D'_Y = D_Y + \delta'_Y$$

$$D'_Z = D_Z$$

where $D_X$, $D_Y$, and $D_Z$ are the coordinates of the (O, X, Y, Z) reference frame without compensation.

On the basis of these shift values and of the coordinates of the centers of gravity of the tang of the blade and of the various airfoil slices T as already calculated, the modified coordinates or the center of gravity of the portion P of the blade situated above the neck are calculated during a step E230 in a manner identical to that of step E150.

APPLICATION EXAMPLE

In this example, the blade is a blade of a low pressure turbine in a gas turbine engine, and it is made of CMC.

In order to compensate the airfoil of such a blade, the airfoil is geometrically subdivided into ten airfoil slices each occupying 10% of the total radial height between the outer platform and the inner platform of the blade.

The table below gives the shift values to be applied to the coordinates of the center of gravity of the airfoil slice lying in the range 90% to 100% of the total radial height of the airfoil during compensation of the airfoil (steps E100 to E160). This slice is the top slice that is situated directly in the vicinity of the outer platform of the blade.

Compensating the airfoil slice situated in the range 90% to 100%

| $M_{faero}$ (in N · mm) | $M_{X\text{-}faero}$ | 106.8 |
|---|---|---|
| | $M_{Y\text{-}faero}$ | 132.1 |
| Mass of blade slice (in g) | | 2.72 |
| Mass of blade outer platform | | 15 |
| Predetermined speed of rotation ω (in rpm) | | 4000 |
| $F_C$ (in N) | | 1739 |
| Shift values to apply to the COG of the airfoil slice (in mm) | $\delta_X$ | 0.076 |
| | $\delta_Y$ | 0.061 |
| Moment generated in the bottom section of the slice by shifting the COG of the slice (in N · mm) | in the X direction | −106.8 |
| | in the Y direction | −132.1 |

Thus, for the airfoil slice situated in the range 90% to 100% of the total radial height of the airfoil, the position of the center of gravity of this airfoil slice needs to be shifted (relative to its original coordinates) by +0.061 mm in the X direction and by +0.076 mm in the Y direction.

It should be observed that for this top slice situated in the range 90% to 100% of the total height of the airfoil, the mass of the outer platform situated above it is taken into account when calculating the centrifugal force that applies thereto (in addition to the mass of the slice). Likewise, the calculation of the position of the center of gravity of this slice takes the presence of the outer platform into account.

The shift values to be applied to all of the other airfoil slices are calculated in the same manner and are therefore not described in detail herein. In particular, these shift values are calculated for the airfoil slice situated in the range 80% to 90% of the total radial height of the airfoil, and then for the slice situated in the range 70% to 80%, and then the slice situated in the range 60% to 70% etc., down to the last slice situated in the range 0% to 10%.

For the same blade, the table below gives the values of the shifts to be applied to the coordinates of the center of gravity of the portion P of the blade constituted by the airfoil, the inner platform, the tang, and the outer platform (i.e. everything that is above the neck) when compensating the tang (steps E200 to E230).

Compensating the portion P of the blade above the neck

| $M'_{faero}$ (in N · mm) | $M'_{X\text{-}faero}$ | 12,931 |
|---|---|---|
| | $M'_{Y\text{-}faero}$ | 18,560 |
| Mass of the portion P of the blade (in g) | | 92.97 |
| Predetermined speed of rotation ω (in rpm) | | 4,000 |
| $F'_C$ (in N) | | 7,483 |
| Shift values to apply to the COG of the portion P of the blade (in mm) | $\delta'_X$ | 2.48 |
| | $\delta'_Y$ | 1.73 |
| Moment generated in the neck by shifting the COG of the portion P of the blade (in N · mm) | in the X direction | −12,931 |
| | in the Y direction | −18,560 |

Thus, for the portion P of the blade constituted by the airfoil, by the inner platform, by the tang, and by the outer platform, the position of the center of gravity of this portion of the blade needs to be shifted (relative to its original coordinates) by +1.73 mm in the X direction, and by +2.48 mm in the Y direction.

It should be observed that these compensations that apply to the airfoil and to the blade portion situated above the neck are calculated for a predetermined speed of rotation of the wheel, i.e. for a particular stage of flight. It is possible to perform such calculations for several predetermined speeds of rotation (and thus for several stages of flight), and to take the average of the resulting data sets.

The invention claimed is:

1. A method of manufacturing a composite material blade having an optimized profile for a rotor wheel of a turbine engine, the blade including an airfoil including a plurality of blade sections stacked in a radial direction of the wheel, a root for mounting on a disk of the wheel and extended by a tang, and an inner platform situated between the tang and the airfoil, the root being connected to the tang by a neck, the method comprising:

entering values relating to a geometrical profile of the blade, to dimensions of the blade, and to a mass of the blade into calculation software;

optimizing the profile of the blade by shifting centers of gravity of various blade sections in tangential and longitudinal directions, said optimizing of the profile of the blade comprising:

compensating the blade airfoil, including subdividing the airfoil into slices, each slice defined between a bottom section and a top section, and for each airfoil slice and for a predetermined speed of rotation of the wheel disk, calculating centrifugal force to which the slice is subjected, calculating moment of aerodynamic force acting on the bottom section of the slice, and calculating shift values to be applied to a center of gravity of the slice in tangential and longitudinal directions to cancel a moment of aerodynamic force acting on the bottom section of the slice; and compensating the blade tang, including calculating centrifugal force to which a portion of the blade situated above the neck is subjected, which portion is constituted by the airfoil, by the inner platform, and by the tang, calculating a moment of the aerodynamic force acting on a bottom section of the tang of the blade, and calculating shift values to be applied to a center of gravity of the blade tang along tangential and longitudinal directions to cancel a moment of aerodynamic force acting on the bottom section of the blade tang; and manufacturing the blade having the optimized profile.

2. A method according to claim 1, wherein the shift values to be applied to the centers of gravity of the airfoil slices and to the blade tang are smoothed over a full height of the blade.

3. A method according to claim 1, wherein the centrifugal force $F_C$ to which each airfoil slice is subjected is given by formula:

$$F_C = M_T \times R_{COG} \times \omega^2$$

with $M_T$ being mass of the airfoil slice; $R_{COG}$ being distance between the axis of rotation of the disk and the center of gravity of the airfoil slice; and w being speed of rotation of the disk at the predetermined speed.

4. A method according to claim 1, wherein shift values $\delta_X$, $\delta_Y$ for application to the center of gravity of an airfoil slice are given by formulas:

$$\delta_X = M_{Y\text{-}faero}/F_C$$

$$\delta_Y = M_{X\text{-}faero}/F_C$$

with: $M_{X\text{-}faero}$ being a component of the moment of the aerodynamic force acting on the bottom section of the slice in the longitudinal direction; and $M_{Y\text{-}faero}$ being a component of the moment of the aerodynamic force acting on the bottom section of the slice in the tangential direction.

5. A method according to claim 1, wherein shift values $\delta'_X$, $\delta'_Y$ for application to the center of gravity of the blade tang are given by formulas:

$$\delta'_X = M'_{Y-faero}/F'_C$$

$$\delta'_Y = M'_{X-faero}/F'_C$$

with: $M'_{X-faero}$ being a component of the moment of the aerodynamic force acting on the bottom section of the blade tang in the longitudinal direction; and $M'_{Y-faero}$ being a component of the moment of the aerodynamic force acting on the bottom section of the blade tang in the tangential direction.

6. A method according to claim 1, wherein the blade also includes an outer platform in a vicinity of the free end of the airfoil, and the compensating the tang applies to a portion of the blade including the airfoil, the inner platform, the tang, and the outer platform of the blade.

7. A method according to claim 1, wherein, in the compensating the blade airfoil, the airfoil is subdivided into ten slices, each occupying 10% of total height of the airfoil.

8. A composite material blade for a rotor wheel of a turbine engine, the blade having an optimized profile and comprising:
- an airfoil including a plurality of blade sections stacked in a radial direction of the wheel;
- a root for mounting on a disk of the wheel and extended by a tang, the rotor wheel being centered on a longitudinal axis of the turbine engine; and
- an inner platform situated between the tang and the airfoil;
- the root being connected to the tang by a neck;
- wherein the blade without the optimized profile has a geometrical profile for which the coordinates of a center of gravity of the blade tang are $D_X$, $D_Y$, and $D_Z$ and in an O, X, Y, Z orthogonal reference frame defined by the rotor wheel, the longitudinal axis X being parallel to the longitudinal axis of the turbine engine and O being centered on the longitudinal axis of the engine, the blade with the optimized profile has an optimized geometrical profile for which coordinates of a center of gravity of the blade tang are given by formulas:

$$D'_X = D_X + \delta'_X$$

$$D'_Y = D_Y + \delta'_Y$$

$$D'_Z = D_Z$$

where:

$\delta'_X$ and $\delta'_Y$ are compensation values for the tang given by formulas:

$$\delta'_X = M'_{Y-faero}/F'_C$$

$$\delta'_Y = M'_{X-faero}/F'_C$$

with:

$M'_{X-faero}$ being a component of the moment of the aerodynamic force acting on a bottom section of the blade tang in the longitudinal direction X; and $M'_{Y-faero}$ being a component of the moment of the aerodynamic force acting on the bottom section of the blade tang in the tangential direction Y.

* * * * *